United States Patent
Sine et al.

(10) Patent No.: US 6,366,867 B2
(45) Date of Patent: *Apr. 2, 2002

(54) METHOD AND APPARATUS FOR PROVIDING CONTROLLABLE COMPENSATION FACTORS TO A COMPENSATED DRIVER CIRCUIT WHICH MAY BE USED TO PERFORM TESTING OF THE STRUCTURAL INTEGRITY OF THE COMPENSATED DRIVER CIRCUIT

(75) Inventors: Christopher John Sine, Palo Alto; Alper Ilkbahar, Santa Cruz; Scott W. Murray, San Jose, all of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/337,568

(22) Filed: Jun. 22, 1999

(51) Int. Cl.[7] ............................. H03K 17/16; G06F 1/26

(52) U.S. Cl. ............................ 702/107; 326/27; 326/30; 326/83; 326/87

(58) Field of Search ...................... 702/107, 83; 326/86, 326/82, 93, 27, 30; 375/257; 714/724; 324/763

(56) References Cited

U.S. PATENT DOCUMENTS

| | | | |
|---|---|---|---|
| 5,621,739 A | | 4/1997 | Sine et al. |
| 5,869,983 A | | 2/1999 | Ilkbahar et al. |
| 5,898,321 A | | 4/1999 | Ilkbahar et al. |
| 6,031,385 A | * | 2/2000 | Ilkbahar ...................... 324/763 |

* cited by examiner

Primary Examiner—Kamini Shah
(74) Attorney, Agent, or Firm—Jeffrey S. Draeger

(57) ABSTRACT

A method and apparatus for providing controllable compensation factors to a compensated driver circuit which may be used to perform testing of the structural integrity of the compensated driver circuit. One disclosed apparatus includes a compensated driver circuit having a number of subcomponents. At least one compensation factor, which may be provided by a compensation circuit, controls which of the subcomponents to enable. An additional circuit is coupled to provide controllable values for the at least one compensation factor.

23 Claims, 3 Drawing Sheets

METHOD AND APPARATUS FOR PROVIDING CONTROLLABLE COMPENSATION FACTORS TO A COMPENSATED DRIVER CIRCUIT WHICH MAY BE USED TO PERFORM TESTING OF THE STRUCTURAL INTEGRITY OF THE COMPENSATED DRIVER CIRCUIT

BACKGROUND

1. Field of the Invention

The present disclosure pertains to the field of testing integrated circuits. More particularly, the present disclosure pertains to testing the multiple separate subcomponents typically associated with compensated driver circuits.

2. Description of Related Art

Testing integrated circuits is a difficult yet important challenge. Improved testing techniques help ensure that high-quality and reliable parts are delivered to customers; however, as integrated circuits grow in size and complexity, the difficulty of thoroughly testing such components increases dramatically. The difficulty of testing integrated circuits further increases when the integrated circuits themselves compensate for varying operating conditions because different structures within the integrated circuit may be enabled to perform the same functions under different operating conditions.

One example of a circuit which may be compensated for varying operating conditions is an output buffer. Typically, a compensation circuit continuously or regularly monitors operating conditions and generates one or more compensation signals which are provided to the output buffer. The output buffer enables a number of subcomponents (e.g., parallel transistor legs) depending on the compensation signals provided by the compensation circuit. Accordingly, the current drive strength of the output buffer is adjusted according to the compensation signals. While the voltage waveform produced may be altered due to changing compensation signals, the actual output value does not change, making it difficult to detect the exact compensation factor value and/or the exact number of enabled parallel output stages at a given point in time.

One way to test integrated circuits with compensated output buffers is to functionally test the device under all expected operating conditions. If the output buffers provide the correct output within a design specification under all of the expected operating conditions, it may be assumed that the output buffer is functioning properly. This type of assumption, however, potentially masks structural defects in one or more subcomponents of the compensated output buffer. For example, it is possible that the buffer still meets its design specification but in fact has an inoperative subcomponent.

Unfortunately, even if the voltage waveforms of the actual signals produced by the buffer are analyzed, detection of the inoperative subcomponents of compensated buffers may remain difficult. In fact, several factors complicate the determination of whether a particular transistor leg causes a change in the output voltage waveform. First, the performance of other non-compensated circuits is affected by the change in operating conditions which caused the additional transistor leg to be enabled in the compensated buffer, thereby potentially obscuring the exact source of a changed voltage waveform. Additionally, changes in buffer switching noise or other complex power or circuit loading interactions may mask failures in the subcomponents of a compensated buffer.

Thus the failure of a subcomponent of a compensated driver circuit may escape detection in a variety of testing environments. Improperly functioning compensated driver circuits may decrease device or system reliability or may even cause failures under conditions that are not sufficiently stressed during testing. Additionally, undetected failures may lead to incorrect assumptions about the performance of such compensated circuits, and future designs based on these incorrect assumptions may be compromised.

Therefore, there is a continuing need to develop techniques to test the various structural components in a compensated circuit such as an output buffer or other driver circuit.

SUMMARY

A method and apparatus for providing controllable compensation factors to a compensated driver circuit which may be used to perform testing of the structural integrity of the compensated driver circuit is disclosed. One disclosed apparatus includes a compensated driver circuit having a number of subcomponents. At least one compensation factor, which may be provided by a compensation circuit, controls which of the subcomponents to enable. An additional circuit is coupled to provide controllable values for the at least one compensation factor.

BRIEF DESCRIPTION OF THE FIGURES

The present invention is illustrated by way of example and not limitation in the Figures of the accompanying drawings.

DETAILED DESCRIPTION

The following description provides a method and apparatus for providing controllable compensation values to a compensated driver circuit which may be used to perform testing of the structural integrity of the compensated driver circuit. In the following description, numerous specific details such as particular compensation subcomponents, compensated driver arrangements, types of driver compensation, and logic partitioning/integration choices are set forth in order to provide a more thorough understanding of the present invention. It will be appreciated, however, by one skilled in the art that the invention may be practiced without such specific details. In other instances, control structures and gate level circuits have not been shown in detail in order not to obscure the invention. Those of ordinary skill in the art, with the included descriptions, will be able to implement the necessary logic circuits without undue experimentation.

Some embodiments of the present invention allow overriding of values provided by a process compensation circuit to ensure operation at a particular compensation level. Additionally, some embodiments perform complete structural testing of compensated driver circuits such as output buffers. Structural testing of compensated circuits may advantageously increase device and/or system reliability and may allow hard-to-detect flaws to be located and analyzed. Moreover, improved structural testing for compensated circuits will continue to grow in importance as compensated circuits are more widely employed and grow in complexity.

Figure 1:
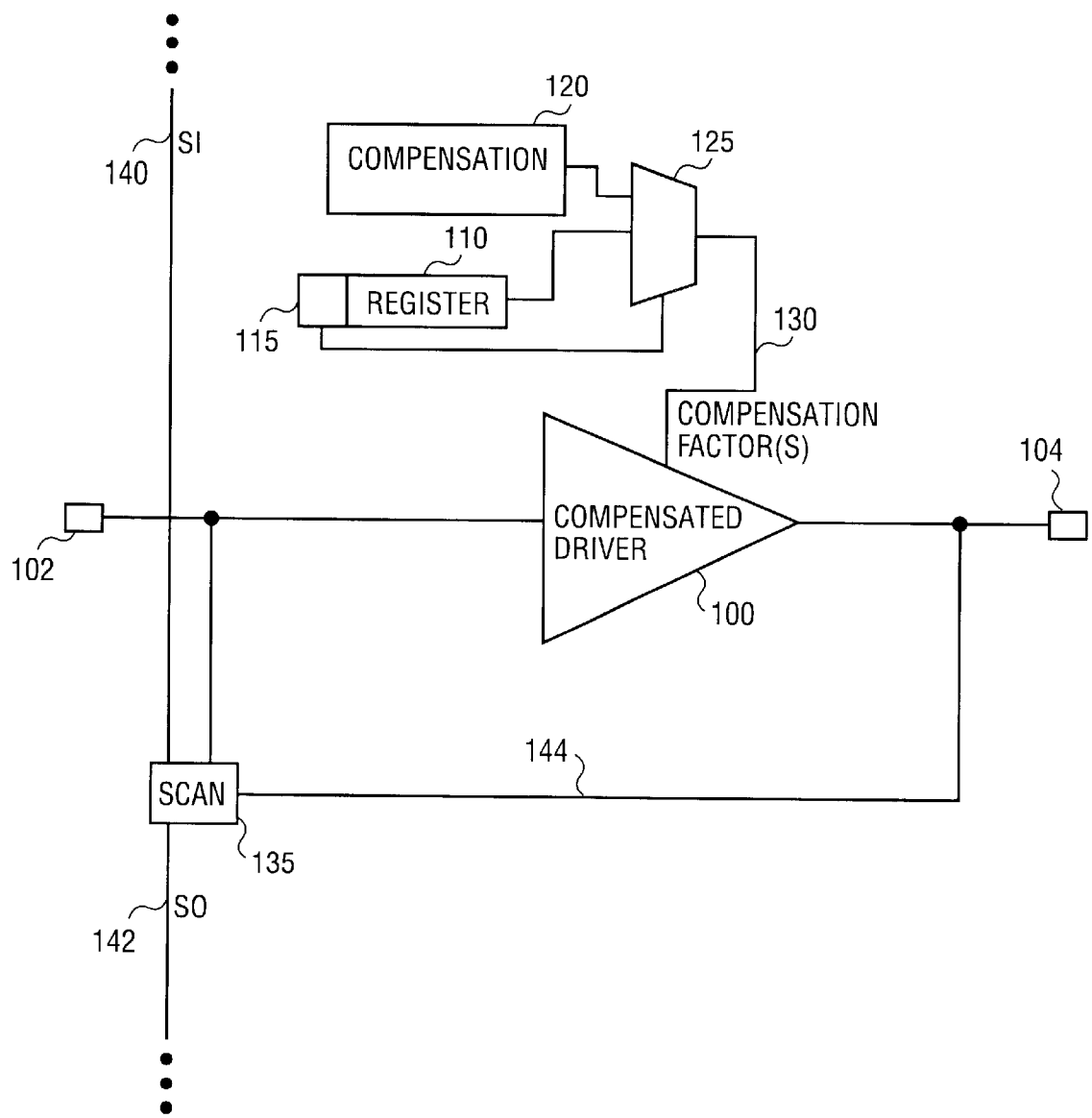
FIG. 1 illustrates one embodiment of a compensated buffer and associated circuitry for providing controllable compensation factors to the compensated buffer.

FIG. 1 illustrates one embodiment of a compensated driver circuit 100 and associated circuitry for providing controllable compensation factors to the compensated driver circuit 100. Similarly to prior art compensated driver circuits, the driver circuit 100 receives one or more compensation factors on a signal line 130 from a compensation circuit 120. The compensation circuit 120 may be any of a variety of known or otherwise available compensation circuits that compensate for changing factors such as manufacturing or fabrication conditions, temperature, voltage levels, or other factors which affect the performance of integrated circuit devices. The compensation circuit 120 continuously or regularly monitors the operating conditions and updates the compensation factor(s). Typically, the compensation circuit 120 is located on the same die or the same component as the compensated driver circuit 100.

In contrast to prior art systems, the embodiment of FIG. 1 includes a register 110 to alternatively provide the compensation factors. The register 110 may be a machine specific or general purpose register which can be programmed through known register programming techniques. Alternatively, the register 110 may be accessible using a scan chain or other techniques typically employed in test mode operations. In any case, the register 110 is accessible so that controllable values may be stored therein, and consequently the compensation factors may be controlled.

A mode field 115 controls a multiplexer 125 which selects either the compensation circuit 120 or the register 110. The mode field 115 may be either a value provided on a signal line, a separate register, or a field in the register 110. Typically, in normal operation, the compensated driver circuit 100 is adjusted according to the compensation factor(s) received from the compensation circuit to drive values received on a data input 102 to a data output 104 in a particular manner.

When the mode field 115 is set to indicate a second mode, values from the register 110 may be provided as compensation factors to control the compensated driver circuit 100. Thus, the data output 104 may be driven at a controlled compensation factor. This allows various compensation factors to be explicitly tested rather than attempting to force the compensation circuit 120 to output various compensation factors by altering the environmental conditions. Clearly such explicit control of the various subcomponents included in the compensated driver circuit 100 is advantageous when attempting to test such circuitry.

Additionally, the embodiment shown in FIG. 1 advantageously allows the values driven at the various compensation factors to be controlled and captured using a scan chain. A scan cell 135 associated with the compensated driver circuit 100 is coupled to both provide data to the compensated driver circuit 100 over a signal line 146 and to capture data driven by the compensated driver circuit 100 by use of a loopback path 144. Externally controlled values may be shifted in to the scan cell 135 via a serial input 140, and captured values may be shifted out of the scan cell 135 via a serial output 142.

Additional circuitry (not shown) may be used to multiplex data and/or enable signals from the scan chain to the input of the compensated driver circuit 100 as well as to implement the loopback mechanism. For example, the mode field 115 or a test signal may control a multiplexer that selects either data from the scan chain or data from the normal data input as the input for the compensated driver circuit 100.

Additionally, an input buffer and/or other input circuitry may be used to couple the output of the compensated driver circuit 100 back to the scan cell 135 to form the loopback mechanism.

In embodiments where a scan chain arrangement is used, various data values can be scanned in and driven at each compensation factor to test the various subcomponents of the compensated driver circuit 100. Additionally, since the scan chain may be routed to numerous compensated driver circuits, testing of an entire set of compensated driver circuits may be simultaneously performed.

Figure 2:
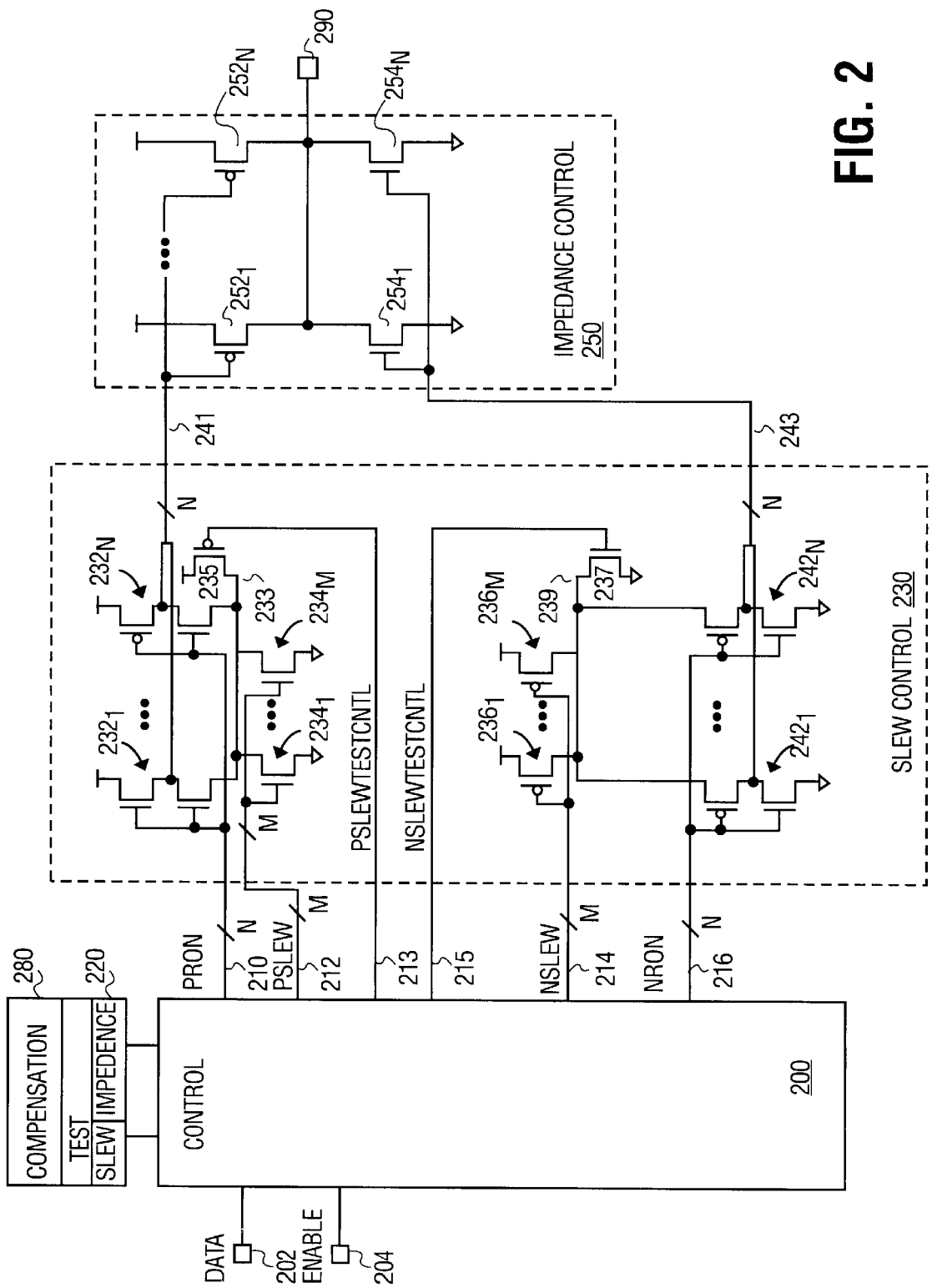
FIG. 2 illustrates details of one embodiment of a compensated buffer and some associated circuitry.

FIG. 2 illustrates details of one embodiment of a compensated driver circuit and illustrates some of the associated circuitry. In the embodiment of FIG. 2, the driver circuit includes two compensated portions, a slew control portion 230 and an impedance control portion 250. The slew control portion 230 is implemented in a section typically considered to be a pre-driver stage, and the impedance control portion 250 is implemented in a section typically regarded as the final driver stage. A wide variety of other arrangements for compensated circuits may be used in other embodiments since disclosed techniques may be applicable to any appropriate circuit receiving a compensation factor.

Each of the slew control portion 230 and the impedance control portion 250 are capable of operating using a varying set of subcomponents according to either a test register 270 or a compensation circuit 280, depending on which mode is selected. In a test mode, the test register 270 provides compensation values whereas in normal operation, the compensation circuit 280 provides compensation values. Other modes of operation are also possible in other embodiments. For example, a fixed compensation value may be set for normal operation if such fixed compensation proves beneficial in a particular system or if the compensation circuit malfunctions.

The slew control portion 230 includes a set of pre-drivers for both N and P driver transistors of the impedance control portion 250. The set of pre-drivers for the final-stage P devices includes N pre-driver circuits $232_1$–$232_N$. These pre-driver circuits are inverters that are each coupled to receive an input of one of a set of N control signals PRON[1:N] on a bus 210 from a control circuit 200. Each of the pre-driver circuits $232_1$–$232_N$ is coupled between Vcc and a node 233. The output of each pre-driver is transmitted via an N bit bus 241 to the final driver stage (the impedance control portion 250).

The PRON control signals indicate whether each of the P channel transistors in the final driver stage should be enabled. The PRON signals are a function of the impedance control factor, the data received at the data input 202, and whether an enable signal is received at the enable input 204. If the data to be driven is a logical 1 (a high voltage level), a set of P channel transistors in the final stage are enabled according to the impedance compensation factor. The various PRON signals are activated (set to a logical 1) for the appropriate transistors in the final stage.

A set of slew rate control transistors $234_1$–$234_M$ are connected in series with the pre-driver circuits $232_1$–$232_N$ from node 233 to ground. The slew rate control transistors $234_1$–$234_M$ effectively operate to control the current passing through the set of pre-driver circuits $232_1$–$232_N$ according to a set of M slew rate control signals PSLEW[1:M] received on a bus 212. The more slew rate control transistors enabled, the faster the pre-drivers can switch the bus 241 to a logical 0 level which enables transistors in the final driver stage. Thus, by varying the set of the M transistors enabled, various slew rates may be achieved. As indicated by the different variables N and M, there may be different numbers of pre-driver legs and slew control devices. The number of final driver legs correspond to the number of pre-driver legs in this embodiment; however, other arrangements are possible.

The slew rate control circuitry for the N channel transistors in the final driver stage operates similarly. The set of pre-drivers for the final-stage N devices includes N pre-driver circuits $242_1$–$242_N$. These pre-driver circuits are inverters that are each coupled to receive an input of one of a set of N control signals NRON[1:N] on a bus 216 from the control circuit 200. Each of the pre-driver circuits $242_1$–$242_N$ is coupled between a node 239 and ground. The output of each pre-driver is transmitted via an N bit bus 243 to the final driver stage (the impedance control portion 250).

The NRON control signals indicate whether each of the N channel transistors in the final driver stage should be enabled. The NRON signals are a function of the impedance control factor, the data received at the data input 202, and whether an enable signal is received at the enable input 204. If the data to be driven is a logical 0 (a low voltage level), a set of N channel transistors in the final stage are enabled according to the impedance compensation factor. The various NRON signals are activated (set to a logical 0) for the appropriate transistors in the final stage.

A set of slew rate control transistors $236_1$–$236_M$ are connected in series with the pre-driver circuits $242_1$–$242_N$ from node 239 to Vcc. The slew rate control transistors $236_1$–$236_M$ effectively operate to control the current passing through the set of pre-driver circuits $242_1$–$242_N$ according to a set of M slew rate control signals NSLEW[1:M] received on a bus 214. The more slew rate control transistors enabled, the faster the pre-drivers can switch the bus 243 to a logical 1 level which enables transistors in the final driver stage. Thus, by varying the set of the M transistors enabled, various slew rates may be achieved. As previously noted with respect to the P channel pre-driver stage, there may be different numbers of pre-driver and slew control devices.

When testing is performed, it may be desirable to individually test each slew control transistor. Therefore, the nodes 233 and 239 could potentially float due to not being pulled respectively to ground or Vcc if a slew control transistor is indeed flawed. For example, a test sequence that tests transistor $234_1$ may provide a data input value of 1 and a slew compensation factor ensuring that only the bit of PSLEW for transistor $234_1$ is enabled. As a result, transistor $234_1$ would either succeed or fail in driving node 233 to ground. If node 233 is not initialized, however, the test result may be ambiguous as the node may have already been at the ground potential. Therefore, a transistor 235, controlled by a PSLEWTESTCNTL signal on a signal line 213, drives node 233 to Vcc prior to performing each slew test. This helps ensure that positive test results are obtained only if the transistor $234_1$ was operational. Similarly, a transistor 237 is controlled by a NSLEWTESTCNTL signal on a signal line 215 to drive node 239 to ground prior to slew control tests in the N channel pre-driver portion.

The slew rate affects the rate of change of the input signal to the final stage, the impedance compensation portion 250. In the embodiment illustrated in FIG. 2, the final stage includes a set of parallel P channel transistors $252_1$–$252_N$ (or transistor legs) coupled between Vcc and an output node 290. The exact set of these transistors which is enabled are controlled by the impedance compensation factor from either the test register 270 or the compensation circuit 280. Specifically, the PRON signals, which are derived from the impedance control factor, cause some or all of the set of final driver transistors $252_1$–$252_N$ to transition.

Similarly, the set of the N channel transistors $254_1$–$254_N$ enabled when the driver circuitry operates is controlled by the impedance compensation factor. The NRON signals from the control circuit 200 cause the appropriate set of pre-drivers to drive the bus 243, thereby enabling the appropriate set of the final N channel transistors $254_1$–$254_N$.

Figure 3:
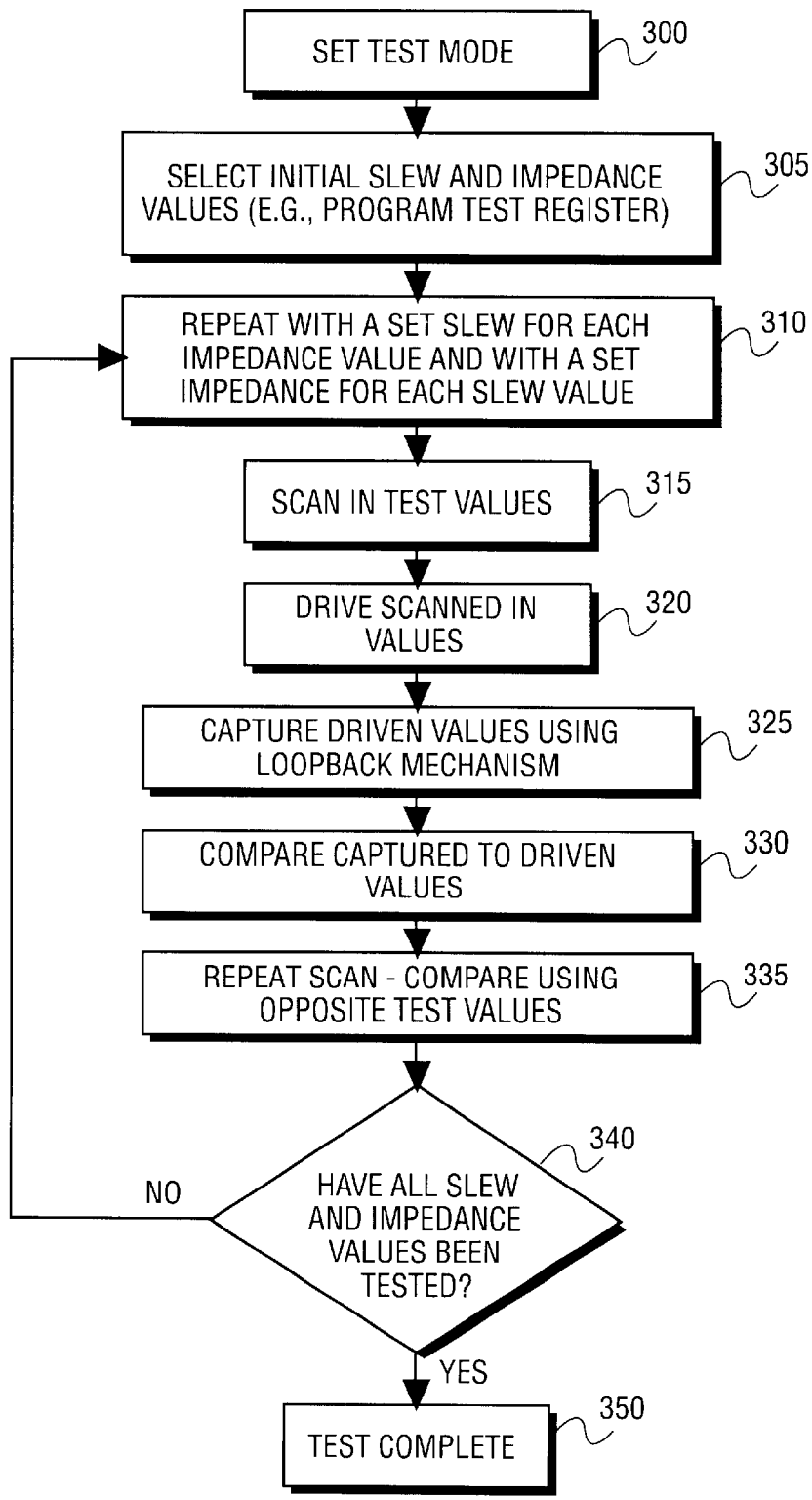
FIG. 3 is a flow diagram illustrating one embodiment of a method for testing compensated driver circuits.

With the circuitry of FIGS. 1 and/or 2, various algorithms may be used to test the various structures of the compensated driver circuit. One specific embodiment is shown in flowchart form in FIG. 3. In this embodiment, each of the various compensation subcomponents of the driver circuit is individually tested. Exhaustive testing, however, is not employed in this embodiment as each possible combination of slew and impedance are not tested together. In other embodiments, exhaustive testing may be performed. Testing only each individual portion once advantageously limits test time and still provides an indication that the structure for each subcomponent is in place (not an open or a short) and generally operational.

In block 300, the test mode is selected. This may be accomplished by writing to a general-purpose or a machine specific register as is well known in the art. Alternatively, the test mode may be selected by asserting a particular signal, by using a scan chain or other test control device, or by any other method which can select a test mode. In block 305, an initial slew and impedance value are chosen. Again, these values may be set using a variety of techniques known in the art or otherwise available. In the embodiment of FIG. 2, of the test register 270 is written with a value indicating both a selected slew compensation factor and a selected impedance compensation factor.

In block 310, iteration through the available slew and impedance compensation factors begins. With a set slew, an impedance compensation factor is tested. This verifies that the tested subcomponent in the impedance compensation portion is functional (assuming there is no failure in other portions of the driver circuit). For example, in the embodiment of FIG. 2, one of the transistors $252_1$–$252_N$ and a corresponding one of the transistors $254_1$–$254_N$ are selected for testing at each iteration in block 310. Subsequent iterations select previously untested transistors in the impedance control portion and then the slew control portion until the each portion is entirely tested.

The testing includes first scanning in test values (e.g., logical 1 or 0 values) as indicated in block 315. The scanned in test values are driven by the compensated driver circuit as indicated in block 320. The driven values are captured using a loopback mechanism as indicated in block 325, and the captured values are compared to the driven values as indicated in block 330. The comparison may be performed by first shifting out the values captured in a scan chain and then comparing the captured values with expected values. Alternatively, results could be accumulated internally until further testing is completed and aggregate results are read.

As indicated in block 335, the process from scanning in the test values in block 315 to comparing the captured driven values in block 330 is typically repeated using the opposite test values. In other words, if logical 1 values are driven in block 315, logical 0 values are thereafter tested as indicated in block 335. Accordingly, both the N channel pre-driver and final driver stages and the P channel pre-driver and final driver stages are tested If, as tested in block 340, all slew and impedance values have been tested, the testing is complete as indicated in block 350. If, however, all slew and impedance values have not been tested, the procedure returns to block 310 where a different slew or impedance value is chosen, and testing is repeated using the one or more new value(s). When complete, each impedance compensation factor is tested at a fixed slew compensation factor, and each slew compensation factor is tested at a fixed impedance compensation factor. Accordingly, all of the various subcomponents of a compensated driver circuit may be controllably tested, thereby allowing greater visibility into the structural integrity, functionality, and performance of the driver circuit.

Thus, a method and apparatus for providing controllable compensation values to a compensated driver circuit which may be used to perform testing of the structural integrity of the compensated driver circuit is disclosed. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. An apparatus comprising:
   a compensation circuit to provide at least one compensation factor comprising a slew compensation factor and an impedance compensation factor;
   a compensated driver circuit having a plurality of driver circuit subcomponents comprising:
      a slew compensation portion having a plurality of slew compensation subcomponents to be selectably enabled according to said slew compensation factor; and
      an impedance compensation portion having a first plurality of parallel transistor portions, a varying number of said first plurality of parallel transistor portions being enabled according to said impedance compensation factor;
   a test register to, in a test mode, override said compensation circuit and control individual ones of the plurality of driver subcomponents.

2. The apparatus of claim 1 wherein said at least one compensation factor controls a number of said plurality of driver circuit subcomponents to enable.

3. The apparatus of claim 1 wherein said circuit is a test circuit that is capable of providing a plurality of compensation factor values to said compensated driver circuit to test each of said plurality of driver circuit subcomponents.

4. The apparatus of claim 1 wherein said test register is coupled to provide said at least one compensation factor to said compensated driver circuit in a first mode, wherein said compensation circuit is coupled to provide said at least one compensation factor to said compensated driver circuit in a second mode in which said compensation circuit monitors operating conditions and updates said at least one compensation factor.

5. The apparatus of claim 1 further comprising:
   a loopback mechanism coupled to internally capture values driven by said compensated driver circuit.

6. The apparatus of claim 5 further comprising:
   a scan chain having at least one scan chain cell for said compensated driver circuit, said at least one scan chain cell being coupled to provide a data value to be driven by said compensated driver circuit and being coupled to capture a driven value from the loopback mechanism.

7. The apparatus of claim 1 wherein said first plurality of parallel transistor portions comprise a plurality of pulldown transistor legs and wherein said plurality of impedance compensation subcomponents further comprise:
   a plurality of pullup transistor legs, a varying number of said plurality of pullup transistor legs being enabled according to said impedance compensation factor.

8. The apparatus of claim 1 wherein said plurality of slew compensation subcomponents comprise:
   a plurality of predriver circuits, each of said plurality of predriver circuits being coupled to drive one of said plurality of impedance compensation subcomponents;
   a plurality of predriver current control devices to control current through said plurality of predriver circuits according to said slew compensation factor.

9. The apparatus of claim 8 wherein said plurality of predriver current control devices comprise a plurality of parallel transistors coupled in series with said plurality of predriver circuits, and wherein a varying number of said plurality of parallel transistors are enabled according to said slew compensation factor.

10. An apparatus comprising:
    a scan chain having a plurality of scan cells in series;
    a plurality of compensated driver circuits, each of said plurality of compensated driver circuits having at least one associated scan cell from said scan chain, said plurality of compensated driver circuits having test circuitry to drive input values from said scan chain at varying and controllable compensation factors and to capture values driven by said plurality of compensated driver circuits in said scan chain.

11. A method comprising:
    programming a register with a test value
    driving a plurality of input values at a selected compensation level from said register rather than a compensation circuit;
    capturing a plurality of captured values driven at said selected compensation level;
    comparing said plurality of captured values to said plurality of input values;
    repeating driving, capturing, and comparing for other selected compensation levels.

12. The method of claim 11 further comprising:
    programming said register to set said selected compensation level.

13. The method of claim 11 wherein repeating driving, capturing, and comparing for other selected compensation levels comprises:
    repeating driving, capturing and comparing for a plurality of different impedance compensation values;
    repeating driving, capturing and comparing for a plurality of slew rate control compensation values.

14. The method of claim 11 wherein said step of driving comprises:
    shifting said plurality of input values into a scan chain;
    driving said plurality of input values from said scan chain at said selected compensation level.

15. The method of claim 14 wherein the step of capturing further comprises:
    providing driven values to scan chain cell inputs via a loopback mechanisms;
    capturing said plurality of captured values in said scan chain.

16. The method of claim 15 further comprising:

shifting said plurality of captured values out of said scan chain prior to comparison.

17. A method comprising:

overriding a compensation circuit compensation value by providing a selected compensation value;

driving an output value using a compensated driver circuit having a plurality of driver subcomponents, a subset of said plurality of driver subcomponents being enabled according to said selected compensation value;

repeating overriding and driving for a plurality of test compensation values including a plurality of impedance compensation values and a plurality of slew rate compensation values.

18. The method of claim 17 further comprising:

capturing said output value as a captured value using a loopback mechanism.

19. The method of claim 18 further comprising:

comparing said captured value to determine if said subset of driver subcomponents are functional.

20. The apparatus of claim 1 further comprising:

a plurality of transistors to resist enabled ones of the driver circuit subcomponents during testing.

21. The apparatus of claim 10 further comprising:

a plurality of transistors to resist enabled ones of the driver circuit subcomponents during testing.

22. The apparatus of claim 11 further comprising:

a plurality of transistors to resist enabled ones of the driver circuit subcomponents during testing.

23. The apparatus of claim 17 further comprising:

a plurality of transistors to resist enabled ones of the driver circuit subcomponents during testing.

* * * * *